(12) United States Patent
Hirano et al.

(10) Patent No.: US 7,793,820 B2
(45) Date of Patent: Sep. 14, 2010

(54) SOLDER PREFORM AND A PROCESS FOR ITS MANUFACTURE

(75) Inventors: Naohiko Hirano, Okazaki (JP); Akira Tanahashi, Okazaki (JP); Yoshitsugu Sakamoto, Toyohashi (JP); Kaichi Tsuruta, Tochigi (JP); Takashi Ishii, Mouka (JP); Satoshi Soga, Mouka (JP)

(73) Assignees: Senju Metal Industry Co., Ltd., Tokyo (JP); Denso Corporation, Kariya (JP)

( * ) Notice: Subject to any disclaimer, the term of this patent is extended or adjusted under 35 U.S.C. 154(b) by 7 days.

(21) Appl. No.: 12/073,690

(22) Filed: Mar. 7, 2008

(65) Prior Publication Data

US 2008/0237301 A1    Oct. 2, 2008

Related U.S. Application Data

(63) Continuation-in-part of application No. PCT/JP2006/318248, filed on Sep. 14, 2006.

(30) Foreign Application Priority Data

Sep. 15, 2005    (JP)    ............... 2005-268209

(51) Int. Cl.
   *B23K 35/22*    (2006.01)
   *B23K 35/24*    (2006.01)
   *B23K 35/36*    (2006.01)

(52) U.S. Cl. ................ 228/246; 228/248.1; 228/248.5; 228/56.3; 164/69.1; 148/24

(58) Field of Classification Search ................ 228/246, 228/248.1, 248.5, 56.3; 164/69.1; 148/24
See application file for complete search history.

(56) References Cited

U.S. PATENT DOCUMENTS

| | | | | | |
|---|---|---|---|---|---|
| 3,472,365 | A | * | 10/1969 | Tiedema | ...................... 206/486 |
| 4,663,815 | A | * | 5/1987 | Hartman et al. | ............... 29/839 |
| 2001/0045244 | A1 | * | 11/2001 | Akaike et al. | .................. 148/25 |
| 2005/0260095 | A1 | * | 11/2005 | Hasegawa | .................... 420/562 |

FOREIGN PATENT DOCUMENTS

| | | | |
|---|---|---|---|
| CH | 225008 | | 4/1943 |
| EP | 1 769881 | | 4/2007 |
| JP | 03 281088 | | 12/1991 |
| JP | 05101751 | A * | 4/1993 |
| JP | 06 031486 | | 2/1994 |
| JP | 06 232188 | | 8/1994 |
| JP | 06 285686 | | 10/1994 |
| JP | 2001 239397 | | 9/2001 |
| JP | 2002 305213 | | 10/2002 |
| JP | 2005 161338 | | 6/2005 |

OTHER PUBLICATIONS

Japanese to English computer translation of JP 06-031486 from IDS.*

* cited by examiner

*Primary Examiner*—Jessica L Ward
*Assistant Examiner*—Erin B Saad
(74) *Attorney, Agent, or Firm*—Michael Tobias

(57) ABSTRACT

A mixed mother alloy is prepared from a solder mixture comprising a pyrolyzable flux and high melting point metal particles, the mixed mother alloy is charged into a large amount of molten solder and stirred, and a billet is prepared. The billet can then be extruded, rolled, and punched to form a pellet or a washer, for example.

19 Claims, 2 Drawing Sheets

SOLDER PREFORM AND A PROCESS FOR ITS MANUFACTURE

REFERENCE TO RELATED APPLICATIONS

This application is a continuation-in-part of International Application No. PCT/JP2006/318248 having an international filing date of Sep. 14, 2006.

BACKGROUND OF THE INVENTION

This invention relates to a solder preform having high melting point metal particles uniformly dispersed therein and a process for its manufacture.

A typical soldering method for constituent parts such as printed circuit boards and electronic parts used in electronic equipment (referred to below as electronic parts or simply as parts) is the reflow soldering method.

The reflow soldering method is a method in which solder is placed only on necessary locations of a part, and then heating is performed by a heating apparatus such as a reflow furnace, an infrared irradiating apparatus, or a laser irradiating apparatus to carry out soldering. The reflow method not only has excellent productivity but can also carry out soldering with excellent reliability in that solder is not adhered to unnecessary locations. Therefore, it is much used in soldering of modern electronic parts which require high reliability.

Solders which are used in the reflow method include solder paste and solder preforms. Solder paste is formed by mixing a viscous flux and solder powder. It is applied by printing or dispensing to portions to which electronic parts are soldered. Flux which is used in solder paste has solids such as rosin and an activator dissolved in a solvent. Therefore, flux residue always adheres to soldered portions after soldering with a solder paste. If flux residue absorbs moisture in the atmosphere, it may produce corrosive products in soldered portions or a deterioration in insulation resistance. Therefore, parts which are soldered with solder paste must generally undergo cleaning of flux residue when high reliability is demanded.

In order to solder electronic parts requiring high reliability, solder preforms which enable soldering without employing flux are used. A solder preform is solder which is previously formed (preformed) into a shape such as a pellet or a washer suited to the portion to be soldered. In a reflow method using a solder preform, the solder preform is placed on a portion to be soldered of an electronic part, and then the part is heated in a reducing atmosphere such as hydrogen gas to perform soldering. If an electronic part having a solder preform placed thereon is heated in a hydrogen atmosphere, the hydrogen acts to reduce and remove oxides adhering to the surface of the portion to be soldered of the part and the surface of the solder preform, thereby allowing the molten solder to wet the surface of the portion to be soldered.

A typical soldering technique which uses a solder preform is die bonding. Die bonding is joining of electronic parts such as a substrate and a semiconductor element with solder. Soldering is carried out by placing a solder preform between the substrate and the semiconductor element followed by heating in a reducing atmosphere.

If parts demanding high reliability are soldered with a solder preform without using flux, the problem of corrosion due to absorption of moisture by flux residue does not occur. Even so, corrosion of soldered portions sometimes becomes a problem. This type of corrosion is due to moisture condensation. If the periphery of a soldered part is subjected to a heat cycle of high temperatures and low temperatures, when the temperature of the part decreases from a high temperature to a low temperature, moisture in the periphery of the part condenses, and water droplets adhere to the soldered portion. In a soldered portion, the ionization tendency of the solder alloy is different from that of the metal of the portion to be soldered of the electronic part. As a result, the adhered water droplets dissolve electrolytes and form a local cell, and the solder or the metal of the part may corrode. In order to prevent corrosion due to moisture in parts demanding high reliability, resin molding or potting in which the entire part is covered with a resin is carried out.

When a solder preform and a semiconductor element are placed on a substrate and heated so that the solder preform melts, the molten solder may be forced out from the desired soldered portions of the parts due to the weight of the semiconductor element, parts such as heat sinks, and jigs or the like, and the amount of solder present between the portions to be soldered may end up becoming small. Joining by soldering can provide a sufficient bonding strength to the extent that a suitable amount of solder is present between portions to be soldered, but if solder is forced out from between portions to be soldered by the weight of a semiconductor element as in die bonding and the amount of solder becomes small, the bonding strength becomes weak.

In order to provide a suitable clearance between portions to be soldered and ensure that a suitable amount of solder is present between portions to be soldered, a technique has been employed in which a plurality of spherical particles of a high melting point metal having a melting point higher than solder such as Ni, Cu, Ag, Fe, Mo, and W (referred to below simply as metal particles) are sandwiched between portions to be soldered. For this purpose, solder preforms which already have metal particles dispersed therein have been used, since it is extremely troublesome and inefficient to separately place discrete metal particles between portions to be soldered at the time of soldering.

Methods of manufacturing solder preforms having metal particles dispersed therein include the pressing method and the melting method.

In the pressing method, a large number of metal particles are placed atop a single solder sheet, the sheet is passed between a pair of rollers to embed the metal particles in the solder sheet, and the sheet is then subjected to punching with a press (see JP H03-281088 A1). Alternatively, metal particles are placed between two solder sheets to form a sandwich, which is then subjected to punching with a press (see JP H06-285686 A1, for example).

In the melting method, metal particles are dispersed in molten solder, and the molten solder is then cast into a mold to form a billet. The billet is extruded to form a solder sheet, and the sheet undergoes punching with a press (see JP H06-31486 A1, for example). In the melting method disclosed in JP H06-31486 A1, the surface of metal particles is first treated by electroplating or electroless plating. A mixture of the metal particles and flux is then charged into molten solder and stirred, and then the molten solder is cast into a mold to form a billet. The billet is then rolled to form a sheet, and the sheet is formed into solder preforms of a predetermined shape with a press.

Because a solder preform which is obtained by the pressing method has metal particles mechanically embedded in a solder sheet or sandwiched between solder sheets, the metal particles have not been wet by molten solder. Namely, the metal particles and the solder are not metallically bonded to each other. Therefore, if such a solder preform is placed between portions to be soldered of electronic parts and the solder preform is melted, a metallic bond is not formed where the metal particles and the portions to be soldered are merely touching. This state decreases the bonding area between the metal particles and solder and causes voids. As a result, not only is the bonding strength inadequate, but the heat dissipation capacity decreases.

Heat dissipation capacity as used herein refers to, in the case of soldering of an electronic part such as a power transistor to a heat sink, for example, the ability to efficiently release heat, which is generated by the electronic part, through the heat sink. Heat dissipation capacity is greatly affected by thermal conductivity in the soldered portions. By improving the heat dissipation capacity, a deterioration in performance of an electronic part due to a temperature increase of the part is prevented.

Particularly in the case of such a heat generating part, if there is not complete bonding between the electronic part and the heat sink, the bonding area becomes small and voids develop, thereby making heat conduction inadequate, and this produces thermal effects on electronic parts.

In solder preforms manufactured by the conventional melting method, since metal particles have been mixed with flux before they are charged into molten solder, it was expected that the metal particles and the solder are metallically bonded to each other to obtain a sufficient bonding strength. However, the bonding strength after soldering was insufficient. When a solder preform obtained by the conventional melting method is used for soldering by sandwiching it between parts and the interior of the soldered portions is observed with an x-ray transmission apparatus, voids which were not visible prior to soldering appear after soldering.

If voids develop in soldered portions, in the same manner as with solder preforms manufactured by the pressing method in which metal particles are not metallically bonded to solder, the bonding area becomes small, and not only does the bonding strength and the heat dissipation capacity decrease, but voids expand due to the heat at the time of soldering and parts sometimes end up tilting.

With solder preforms manufactured by the conventional melting method, it has been sometimes observed after soldering that flux oozes out to the periphery of soldered portions. If flux oozes out to the periphery of soldered portions, the flux causes corrosion. In addition, when resin molding or potting is carried out in order to protect soldered portions against moisture, the flux is mixed into the resin and may interfere with curing of the resin.

In light of the above circumstances, there exists a need for a solder preform containing metal particles which does not develop voids at the time of solder bonding of parts and which does not experience a decrease in strength or a decrease in corrosion resistance and a process for its manufacture.

SUMMARY OF THE INVENTION

The present inventors focused on the melting method. As a result of diligent investigation of the cause of the occurrence of voids and oozing of flux to the periphery of soldered portions with a solder preform obtained by the conventional melting method, they found that there is a problem with flux used when manufacturing solder preforms and with a process for manufacturing solder preforms.

In general, it has been thought that flux completely vaporizes when it is exposed to a high temperature at the time of soldering. However, according to the findings of the present inventors, when flux used in ordinary soldering is mixed with metal particles and charged into molten solder, even if the flux is heated to a high temperature, it does not completely vaporize, and a minute amount of flux remains adhering to the surface of the metal particles.

In the conventional melting method, a mixture of flux and metal particles is directly charged into a large amount of molten solder and stirred, and the mixture is made into a billet. Therefore, a stirring operation is carried out only one time, and it was found that flux adhering to metal particles is not completely eliminated.

If even a minute amount of flux remains in a solder preform, even though the flux itself does not become voids, when such a solder preform is sandwiched between the portions to be soldered of parts and heated, the flux vaporizes and produces voids.

Namely, when flux is mixed with metal particles, solids in the flux such as rosin, an activator, and a thixotropic agent are dissolved in a solvent. When the flux is charged into molten solder, a large portion of the solvent vaporizes, and the solids remain as flux. Flux remaining in a solder preform is a solid at room temperature, but when the remaining flux is heated at the time of soldering, it is liquified and then vaporized. When flux undergoes a phase change from a liquid to a gas, its volume increases by several thousand times, and even a minute amount of flux forms large voids. Therefore, as described above, with a solder preform in which a minute amount of flux remains, the bonding area decreases, thereby decreasing the bonding strength and heat dissipation capacity and causing parts to tilt. In addition, when a solder preform is melted, flux remaining in the solder preform oozes out from the solder and adheres to the periphery of soldered portions and has an effect on the curing of resins used for resin molding or potting.

Flux adhering to metal particles can be removed from the metal particles by thoroughly carrying out stirring. However, if metal particles are contacted with molten solder for a long period of time for the purpose of stirring, the metal particles are eroded by molten solder, as a result of which the metal particles become small or completely melt into the molten solder.

The present inventors found that if stirring is performed a plurality of times for a short period after metal particles are charged into molten solder, flux adhering to the metal particles can be entirely removed and metal particles are no longer eroded by molten solder. In addition, if components which are easily decomposed by the heat of molten solder are used to form a flux which is mixed with metal particles, the flux will no longer remain in a solder preform.

The present inventors also found that if metal particles are directly charged into molten solder, a long time is required for uniform dispersion of metal particles, and erosion of metal particles progresses. Such problems can be solved by previously mixing metal particles and a small amount of molten solder to prepare a mixed mother alloy and charging the mixed mother alloy into molten solder. The flux remaining at the time of preparation of the mixed mother alloy can also be completely eliminated when subsequently charging the mixed mother alloy into molten solder.

The present invention was completed based on such findings. According to one aspect of the present invention, a process for manufacturing a solder preform comprises the following steps:

(1) mixing high melting point metal particles and a pyrolyzable liquid flux to form a mixture;

(2) preparing a mixed mother alloy by charging the mixture into molten solder followed by stirring;

(3) preparing a billet by charging the mixed mother alloy into molten solder followed by stirring and casting into a mold;

(4) forming the billet into a member suitable for punching; and (5) punching the member to form a solder preform.

According to another aspect of the present invention, a solder preform has high melting point metal particles uniformly dispersed in the solder preform. No voids or flux are present at all in the solder preform, and the surfaces of the high melting point particles are metallically bonded to solder.

A mixed mother alloy which is employed in the present invention and a mother alloy which is typically used when preparing a metal alloy have similar methods of use, but they have different make-ups. A mother alloy used in a typical alloy contains a high concentration of an alloying metal element which is added to molten metal and is completely dissolved therein, and the mother alloy is diluted such that a predetermined composition is obtained. In contrast, a mixed mother alloy used in the present invention contains a large amount of high melting point metal particles mixed and dispersed in solder in the form of unmelted metal particles. When the actual amount of the metal particles in solder is obtained, the required amount of the mixed mother alloy is measured and charged into molten solder.

There are no particular restrictions on the mixing ratio of the mixed mother alloy and molten solder as long as the amount of high melting point metal particles which are supplied is sufficient to uniformly disperse the high melting point metal particles in the solder preform which is finally obtained. At this time, the alloy composition of the matrix phase of the mixed mother alloy and that of the molten solder are preferably the same, but it is also possible for them to have different alloy compositions from each other. However, even when their compositions are different, the compositions and mixing ratio are preferably previously adjusted so that the solder alloy after melting has a predetermined composition.

In a process for manufacturing a solder preform according to the present invention, a mixture of flux and metal particles is charged into molten solder and then stirred and rapidly cooled when preparing a mixed mother alloy, and the mixed mother alloy is then charged into molten solder and again stirred and rapidly cooled when preparing a billet. Therefore, a stirring operation is carried out two times, and flux adhering to metal particles is thereby completely removed. In addition, flux used in a manufacturing process according to the present invention easily undergoes pyrolysis (thermal decomposition). Therefore, when the mixture is charged into molten solder or when the mixed mother alloy is charged into molten solder, the flux completely decomposes and does not remain in solder. Accordingly, when carrying out soldering of parts with a solder preform obtained by the manufacturing process according to the present invention, not only is there no occurrence of voids, but there also is no oozing of flux to the periphery of soldered portions.

As a solder preform according to the present invention has metal particles uniformly dispersed therein, when parts are soldered, a constant clearance is obtained between the portions being soldered of the parts, and voids are not present in the solder preform. Therefore, the inherent bonding strength of solder can be exhibited.

In addition, because a solder preform according to the present invention does not have oozing of flux to the periphery of soldered portions, the curing of resin is not impeded even if resin molding or potting is carried out after soldering. As a result, soldered portions of excellent reliability are obtained.

DESCRIPTION OF PREFERRED EMBODIMENTS

Flux used in a process for manufacturing a solder preform according to the present invention must be flux which completely vaporizes or separates by the heat of molten solder when it is mixed with metal particles and charged into molten solder. Namely, the flux must be one in which the rosin, activator, and solvent which are components constituting the flux completely vaporize and decompose or separate at the melting temperature of solder.

Examples of a rosin which can be used as a flux component in the present invention are hydrogenated rosin, phenol modified rosin ester, and polymerized rosin; examples of an activator are adipic acid, succinic acid, maleic acid, benzoic acid, and diethylaniline HBr; examples of a solvent are ethylene glycol monomethyl ether, ethylene glycol monoethyl ether, ethylene glycol monobutyl ether, diethylene glycol monomethyl ether, diethylene glycol monethyl ether, and 2-propanol.

The above-described rosins and activators of the flux decompose or separate from the solder surface and do not remain in the solder at all at 285° C. which is the temperature at which the metal particles are dispersed in a Sn—Cu—Ni—P based lead-free solder (melting point of approximately 230° C.) comprising 99 mass percent of Sn and a remainder of Cu, Ni, and a minute amount of P. The above-described solvents have a boiling point of 230° C. or less, and they completely vaporize at the melting temperature of the above-described lead-free solder and does not remain in solder. One example of a preferred flux composition used in the present invention is as follows. The flux of this example has 80% loss in weight at 285° C. on a heating weight loss curve obtained by TG.

60.0 mass percent of rosin (hydrogenated rosin),
10.0 mass percent of activator (diethylaniline HBr), and
30.0 mass percent of solvent (ethylene glycol monoethyl ether).

Figure 1:
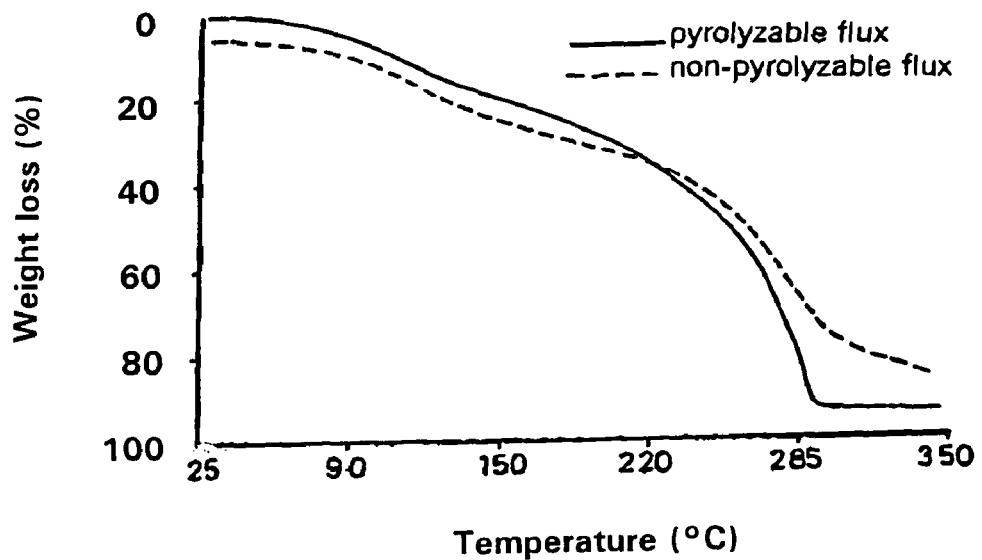
FIG. 1 shows heating weight loss curves obtained by TG (thermogravimetry) of a pyrolyzable flux and a non-pyrolyzable flux.

A pyrolyzable flux which is used in the present invention has a weight loss of at least 80% at 285° C. on a heating weight loss curve obtained by TG as shown by the solid line in FIG. 1.

Lead-free solders having Sn as a main component which are much used at present have a liquidus temperature in the vicinity of 230° C. When a mixture of flux and metal particles is charged into such a lead-free solder to prepare a mixed mother alloy, the lead-free solder is heated to a temperature of at least 285° C. Therefore, the flux in the mixture must be one which vaporizes to give a weight loss of at least 80% at a temperature of 285° C. The fact that at least 80% of the flux vaporizes at a temperature of 285° C. means that the remaining 20% floats on top of the molten solder, and the probability of the flux remaining in the solder becomes small. As shown by the dashed line in FIG. 1, a flux used in usual soldering (a non-pyrolyzable flux) has a weight loss of approximately 65% at 285° C. In this state, a large amount of flux remains in molten solder. The heating weight loss curve obtained by TG is obtained by measuring the change in weight of a sample with a thermobalance while the sample is heated at a constant rate of temperature increase. The actual weight loss on heating of flux can be inferred from this curve.

In the present invention, metal particles are not directly charged into molten solder so as to achieve a predetermined proportion of a solder preform. Instead, metal particles are first mixed in a higher proportion to prepare a mixed mother alloy, and the mixed mother alloy is charged into molten solder. If a predetermined amount of metal particles is directly charged into a large amount of molten solder and stirring is performed as in the conventional melting method, a long time is required until the metal particles are dispersed in the molten solder. During this period, the metal particles are eroded by molten solder, whereby the metal particles have a gradually decreasing particle diameter and end up being consumed. However, by preparing a mixed mother alloy with a higher mixing proportion of metal particles as in the present invention, the amount of solder to be mixed with the metal particles becomes smaller. Therefore, all of the metal particles are easily dispersed in the molten solder, and dispersing is carried out in a short length of time. The length of time for which the metal particles contact molten solder in the subsequent rapid cooling also becomes short, and erosion of the metal particles does not take place.

When the resulting mixed mother alloy is then charged into a large amount of molten solder, since the metal particles are already metallically bonded to solder in the mixed mother alloy, the mixed mother alloy is dispersed in a large amount of molten solder in a short length of time. In this case, the flux remaining in the mixed mother alloy is completely removed by the two occurrences of melting and stirring. Then, by pouring the molten solder having metal particles uniformly dispersed therein into a mold for a billet and rapidly cooling the mold, a billet having metal particles uniformly dispersed therein is obtained.

The concentration or density of high melting point metal particles in the mixed mother alloy can be of a level such that high melting point metal particles are dispersed with a desired density when the mixed mother alloy is added to molten solder and melted. In general it is on the order of 0.1-1 particle/mm$^2$. This concentration or density is diluted by about 10 to 50 times with molten solder.

In a manufacturing process according to the present invention, a pyrolyzable flux is used to form a mixture which is used when preparing a mixed mother alloy. For this reason, when the mixture is charged into molten solder, almost all of the flux decomposes and vaporizes. Therefore, even if a minute amount of flux remains in the mixed mother alloy, when the mixed mother alloy is charged into molten solder in a subsequent step, the flux completely decomposes and none remains in the solder. However, if it is desired to ensure that flux is completely removed from solder, at the time of preparing the mixed mother alloy or a billet, the molten solder can be placed in a vacuum apparatus and be subjected to vacuum treatment. In the present invention, vacuum treatment is treatment which maintains molten solder at a reduced pressure. There is no particular limit on the level of vacuum at this time, but in general, it is preferably approximately 10-100 Pa. The duration of vacuum treatment is such that flux can be completely removed. For example, approximately 1-5 minutes are sufficient.

This vacuum treatment can be carried out at the time of preparing a mixed mother alloy or at the time of preparing a billet or at both times. If molten solder undergoes vacuum treatment in this manner, not only flux present in the solder but also gases and impurities such as oxygen, nitrogen, intermixed oxides, and sulfides can be removed from the molten solder. As a result, solderability can be increased, and the occurrence of voids can be eliminated.

In the present invention, a mixed mother alloy is prepared by first dispersing metal particles in a larger proportion than the proportion of metal particles to be dispersed in a solder preform to prepare a mixed mother alloy in which the metal particles are mixed in the state that they are wet by molten metal. A suitable mixing proportion of metal particles in the mixed mother alloy is 2-30 mass percent.

When rectangular portions are soldered to each other, the number of metal particles which are dispersed to make it possible to maintain the portions to be soldered parallel to each other and leave a constant clearance between them is theoretically at least four such that there is one particle in each of four corners of the rectangle. However, if the four metal particles are arranged in a straight line or if they collect in one location, portions to be soldered will not be parallel and a constant clearance can not be maintained. Therefore, the metal particles are preferably dispersed over the entire region of the portions to be soldered.

In this respect, when a square solder preform is divided into nine equal small squares, even if metal particles are not present in two of the nine small squares, if at least one metal particle is present in each of the remaining seven small squares, a part disposed atop the solder preform does not tilt when the solder preform is melted.

Figure 2:
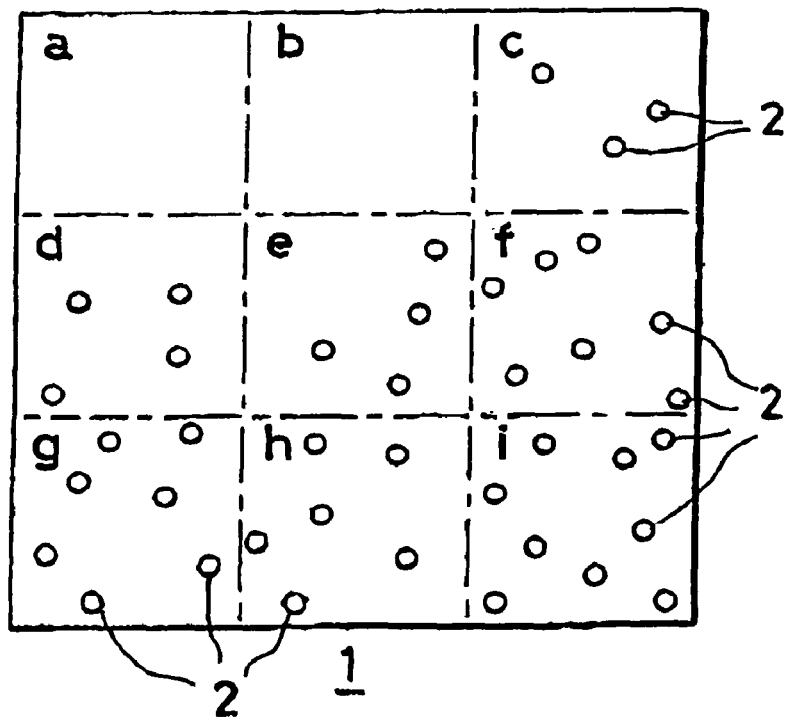
FIG. 2 is a schematic view for explaining the state of dispersion of high melting point metal particles in a pellet-shaped solder preform according to the present invention.
Figure 3:
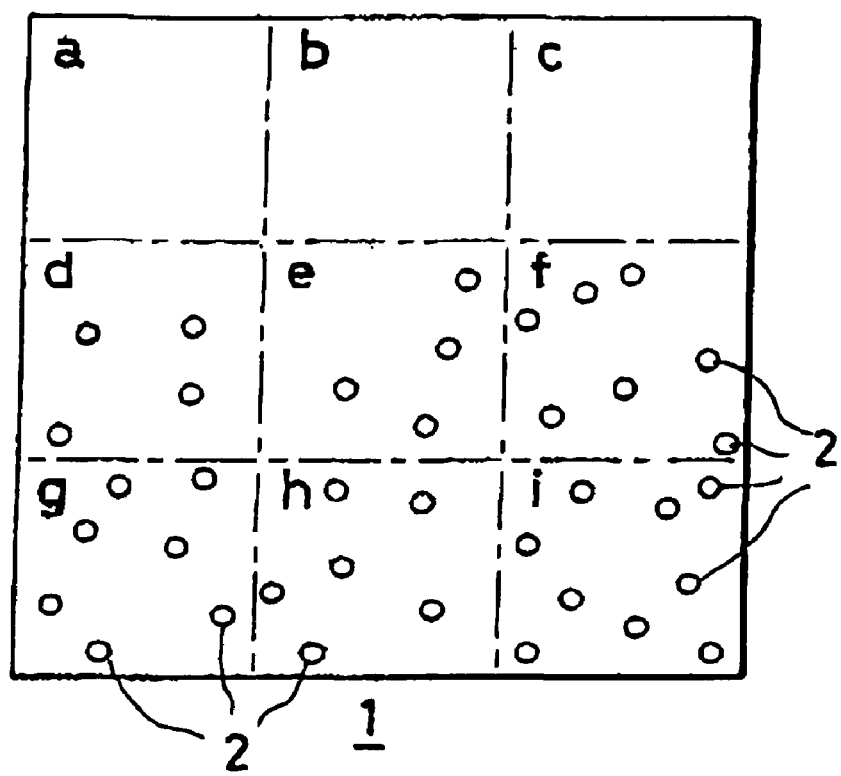
FIG. 3 is a schematic view for explaining the state of dispersion of high melting point metal particles in a conventional pellet-shaped solder preform.

Namely, when the square preform 1 shown in FIG. 2 is divided into nine equal small squares (a, b, c, d, e, f, g, h, i), even if metal particles are not present in two of the small squares a and b of the nine small squares, it is sufficient for at least one metal particle 2 to be present in each of the remaining seven small squares c, d, e, f, g, h, and i. Even if metal particles are not present in the two small squares a and b, for example, at the time of soldering, a part is maintained parallel by the other small squares so that the part does not tilt. In the same manner, the part does not tilt even if metal particles are not present in two other small squares. However, as shown in FIG. 3, in the case in which metal particles are not present in three of the small squares a, b, and c, a part ends up sloping when force is applied to one side thereof.

Measurement of the number of metal particles can be carried out with an x-ray transmission apparatus.

High melting point metal particles dispersed in a solder preform according to the present invention must have a melting point higher than that of the solder preform, and the metal particles must be easily wet by molten solder. Examples of metal particles which can be used in the present invention are particles of Ni, Cu, Ag, Fe, Mo, and W, but preferred metal particles for use in the present invention are Ni particles. Ni particles are not easily eroded by molten solder, and they are inexpensive and readily commercially available as minute balls. Of course, alloys of these metals may be used.

The clearance between soldered portions between which the metal particles are sandwiched is not necessarily the same as the diameter of the metal particles, and it is normally slightly larger than the diameter of the metal particles. This is so that the metal particles will not contact a part at the time of soldering and so that solder will be present between the metal particles and the part. Therefore, the clearance is preferably larger than the diameter of the metal particles by the amount of solder. However, when the weight of a part or a jig or the like is large or a pressing force is applied to the part, almost all of the solder between the part and the metal particles disappears, and the part contacts the metal particles. Even in such a state, the minimum clearance between a part and a portion being soldered must be at least 20 μm. Namely, if the clearance between a part and a portion being soldered is less than 20 μm, the amount of solder becomes small, and the inherent bonding strength of solder can no longer be exhibited. For this reason, the diameter of metal particles is at least 20 μm. Preferably it is from 40-300 μm.

In general, the thickness of a solder preform is roughly equal to the desired clearance. Accordingly, the metal particles used in the solder preform have a diameter close to the clearance. However, if the thickness of the solder preform and the diameter of the metal particles are the same, at the time of forming a solder preform, the metal particles end up being exposed on the surface of the solder preform, and solder does not adhere to the exposed portions. As a result, a part is not metallically bonded to the exposed portions of the metal particles at the time of soldering. In the case of a thick solder preform, the diameter of metal particles is preferably made at most 90% of the thickness of the solder preform in order to leave molten metal which covers the upper and lower portions of the particles with solder in the thickness direction of the solder preform.

A solder preform according to the present invention may comprise an alloy of any composition, but a lead-free solder is particularly suitable due to recent restrictions on the use of Pb. A lead-free solder has Sn as a main component to which Ag, Cu, Sb, Bi, In, Zn, Ni, Cr, Mo, Fe, Ge, Ga, P and the like are suitably added. Sn tends to easily erode metal particles, so when using Ni particles, Ni may be added to the lead-free solder in advance.

Namely, when using Ni particles as the high melting point metal particles, if Ni is contained in the lead-free solder, it becomes difficult for the Ni particles to be eroded when the molten lead-free solder contacts the Ni particles. Examples of Ni-containing lead-free solders include Sn—Cu—Ni—P based solders, Sn—Ag—Ni based solders, Sn—Cu—Ni based solders, Sn—Ag—Cu—Ni based solders, Sn—Zn—Ni based solders, Sn—Sb—Ni based solders, Sn—Bi—Ni based solders, and Sn—In—Ni based solders.

Molten solder which is prepared in this manner is cast into a mold and rapidly cooled to form a billet. The billet is next formed by extruding using an extruder into a member suitable for rolling, such as a strip. The extruded member is then subjected to rolling to form it into a rolled member suitable for punching, such as a ribbon which is thinner than the strip. These operations themselves can be carried out in accordance with the procedures employed in the already known melting method, and there are no particular restrictions on them in the present invention.

The ribbon or other rolled member can be processed by punching with a press to form so-called solder preforms of various shapes such as pellets or washers.

A portion of a manufacturing process according to the present invention can be applied not only to the manufacture of a solder preform such as a pellet or a washer but also to the manufacture of solder wire. Namely, a mixture comprising a liquid flux and metal particles is mixed into molten solder to prepare a mixed mother alloy, the mixed mother alloy is charged into molten solder, and stirring is performed to manufacture a billet. By using the mixed mother alloy, high melting point metal particles can be uniformly dispersed.

A billet which is obtained in this manner can then be subjected to extrusion and wire drawing to form wire-shaped solder such as solder wire or flux cored solder wire. Since the wire-shaped solder also contains metal particles, it can maintain the clearance of a soldered part constant after soldering.

Next, examples of the present invention and comparative examples will be explained.

Example 1

Solder preforms were prepared by the following steps (1)-(6).

(1) Ni particles with a diameter of 50 μm were washed with dilute hydrochloric acid to clean their surfaces, and 4.5 grams of the Ni particles which had their surfaces cleaned were mixed with 0.45 grams of a pyrolyzable liquid flux having the following composition to obtain a mixture.

The composition of the liquid flux used at this time was as follows. Its weight loss at 285° C. was 80% on a heating weight loss curve obtained by TG.

60.0 mass percent of rosin (hydrogenated rosin),
10.0 mass percent of activator (diethylaniline HBr), and
30.0 mass percent of solvent (ethylene glycol monoethyl ether).

(2) The mixture was charged into 125 g of a Sn—Cu—Ni—P based lead-free solder (melting point of approximately 230° C.) comprising 99 mass percent of Sn and a remainder of Cu, Ni, and a minute amount of P which had been melted at approximately 285° C. in a cast iron ladle, and the molten solder was stirred for approximately 30 seconds with a metal spatula and then cast into a mold measuring 5×10×50 mm. The mold was rapidly cooled with water to prepare a rod-shaped mixed mother alloy. This mixed mother alloy was washed with 2-propanol to remove flux residue which separated from the solder surface. The content of Ni particles in the mixed mother alloy was approximately 3.4 mass percent.

(3) Approximately 2.7 kg of a Sn—Cu—Ni—P based lead-free solder having the same composition as described above were melted by heating at approximately 280° C. in a metal ladle, and 129.5 g of the above-described mixed mother alloy were charged into the molten lead-free solder. The molten solder was stirred for approximately 30 seconds with a metal spatula. Then, the molten lead-free solder in which Ni particles were dispersed was cast into a cylindrical mold for a billet, and the mold was rapidly cooled with water to prepare a billet.

(4) The billet was extruded with an extruder to form a strip with a thickness of 5 mm and a width of 20 mm.

(5) The strip was rolled in a rolling mill to a thickness of 0.2 mm and a width of 15 mm to form a ribbon.

(6) The ribbon was punched with a press to form pellet-shaped solder preforms measuring 10×10 mm.

Example 2

Solder preforms were prepared by the following steps (1)-(6).

(1) Ni particles with a diameter of 50/m were washed with dilute hydrochloric acid to clean their surfaces, and 4.5 g of the Ni particles with cleaned surfaces were mixed with 0.45 g of a pyrolyzable liquid flux having the following composition to obtain a mixture.

The flux composition used in this example was as follows. Its weight loss at 285° C. was 80% on a heating weight loss curve obtained by TG.

60.0 mass percent of rosin (hydrogenated rosin),
10.0 mass percent of activator (diethylaniline HBr), and
30.0 mass percent of solvent (ethylene glycol monoethyl ether).

(2) The mixture was charged into 125 g of a Sn—Ag—Cu based lead-free solder (melting point of approximately 220° C.) which had been melted at 285° C. in a crucible, and after stirring was performed for approximately 20 seconds with a metal spatula, the crucible was left in a vacuum apparatus for approximately 3 minutes to perform vacuum treatment. Then, the crucible was removed from the vacuum apparatus and after stirring was performed again for 5 seconds, the molten solder in which Ni particles were dispersed was then cast into a mold measuring 5×10×50 mm. The mold was rapidly cooled with water to prepare a rod-shaped mixed mother alloy. This mixed mother alloy was washed with 2-propanol to remove flux residue which separated from the solder surface. The content of Ni particles in this mixed mother alloy was approximately 3.4 mass percent.

(3) Approximately 2.7 kg of a Sn—Ag—Cu based lead-free solder was melted by heating at 280° C. in a metal ladle, 129.5 g of the mixed mother alloy were charged into the molten lead-free solder, and stirring was performed with a metal spatula for approximately 30 seconds. Then, the molten lead-free solder in which Ni particles were dispersed was cast into a cylindrical mold for a billet, and the mold was rapidly cooled with water to prepare a billet.

(4) The billet was extruded with an extruder to form a strip with a thickness of 5 mm and a width of 20 mm.

(5) The strip was rolled with a rolling mill to a thickness of 0.2 mm and a width of 15 mm to form a ribbon.

(6) The ribbon was punched with a press to form pellet-shaped solder preforms measuring 10×10 mm.

Comparative Example 1

Solder preforms were prepared by the following steps (1)-(5).

(1) Ni particles measuring 50 μm were washed with dilute hydrochloric acid to clean their surfaces, and 4.5 g of the Ni particles which had their surfaces cleaned were mixed with 0.45 g of a liquid flux which is difficult to pyrolyze and which had the following composition to prepare a mixture.

The flux composition used in this example was as follows. Its weight loss at 285° C. was 65% on a heating weight loss curve obtained by TG.

60.0 mass percent of rosin (WW grade rosin),
10.0 mass percent of activator (diethylamine HBr), and
30.0 mass percent of solvent (diethylene glycol monobutyl ether).

(2) The mixture was charged into a large amount, i.e., approximately 2.7 kg of a Sn—Cu—Ni—P based lead-free solder (melting point of approximately 230° C.) which had been melted at approximately 285° C. in a cast iron ladle and, and after stirring for approximately 30 seconds with a metal spatula, the molten lead-free solder was cast into a cylindrical mold for a billet to prepare a billet.

(3) The billet was extruded with an extruder to form a strip with a thickness of 5 mm and a width of 20 mm.

(4) The strip was rolled with a rolling mill to form a ribbon with a thickness of 0.1 nm and a width of 15 mm.

(5) The ribbon was punched with a press to form pellet-shaped solder preforms measuring 10×10 mm.

The solder preforms obtained by the above-described examples and comparative example were observed with an x-ray transmission apparatus. The solder preforms obtained in the examples had a large number of Ni particles present in all of 9 equal small squares, and there were no voids.

A solder preform obtained in each of the examples was sandwiched between a bare chip and a heat sink and heated at 280° C. in a hydrogen atmosphere to carry out soldering, and then the periphery of the soldered portion was observed with a microscope. No oozing of flux was observed. There were also no voids when the soldered portion after soldering was observed with an x-ray transmission apparatus. The bare chips and the heat sinks were parallel to each other, and the clearance was 80 μm.

In contrast, a solder preform obtained in the comparative example did not have Ni particles in 4 of the 9 equal small squares, and a large number of minute voids were present when the solder preform was observed with an x-ray transmission apparatus.

When the solder preform was used for soldering under the same conditions as for the examples, oozing of flux to the periphery of the soldered portions was observed. In addition, when the soldered portion was observed with an x-ray transmission apparatus, the presence of large voids was observed.

According to the present invention, voids are not observed in solder joints of soldered portions, metal particles are uniformly dispersed, an excellent heat dissipation capacity is provided in heat-generating parts and the like, and a constant clearance is provided.

What is claimed is:

1. A process for manufacturing a solder preform comprising the steps of:
   (1) mixing high melting point metal particles with a pyrolyzable liquid flux to obtain a mixture;
   (2) charging the mixture into molten solder at a temperature lower than the melting point of the high melting point metal particles followed by stirring to prepare a mixed mother alloy in which the high melting point particles are dispersed;
   (3) charging the mixed mother alloy into molten solder at a temperature lower than the melting point of the high melting point metal particles followed by stirring and casting into a mold to prepare a billet;
   (4) forming the billet into a member suitable for punching; and
   (5) punching the member to form a solder preform containing the high melting point metal particles dispersed in a solder alloy matrix phase.

2. A process for manufacturing a solder preform as claimed in claim 1 wherein forming the billet into a member suitable for punching includes extruding the billet.

3. A process for manufacturing a solder preform as claimed in claim 1 wherein forming the billet into a member suitable for punching includes rolling.

4. A process for manufacturing a solder preform as claimed in claim 1 wherein the pyrolyzable liquid flux is a flux which has a weight loss of at least 80% at 285° C. on a heating weight loss curve measured by thermogravimetry.

5. A process for manufacturing a solder preform as claimed in claim 1 wherein the molten solder is subjected to vacuum treatment in at least one of the step of preparing a mixed mother alloy and the step of preparing a billet.

6. A process for manufacturing a solder preform as claimed in claim 1 wherein the high melting point metal particles are Ni particles.

7. A process for manufacturing a solder preform as claimed in claim 1 wherein the high melting point metal particles have a diameter of at least 20 μm.

8. A process for manufacturing a solder preform as claimed in claim 1 including completely decomposing the flux prior to the casting.

9. A process for manufacturing a solder preform as claimed in claim 1 wherein the high melting point metal particles have a diameter of at most 90% of a thickness of the preform.

10. A process for manufacturing a solder preform as claimed in claim 1 including solidifying the mixed mother alloy to obtain a mixed mother alloy having high melting point metal particles with a particle diameter of at least 20 μm dispersed therein.

11. A process for manufacturing a solder preform as claimed in claim 1 wherein the mixed mother alloy comprises an alloy matrix phase and unmelted metal particles with a particle diameter of at least 20 μm uniformly dispersed in the matrix phase.

12. A process for manufacturing a solder preform as claimed in claim 1 wherein the high melting point metal particles are dispersed in the solder preform, and the high melting point metal particles in the solder preform have a particle diameter of at least 20 μm.

13. A process as claimed in claim 12 wherein the high melting point metal particles in the solder preform have a particle diameter of 40-300 μm.

14. A process for manufacturing a solder preform as claimed in claim 1 wherein the molten solder into which the mixture is charged comprises an Ni-containing solder alloy.

15. A process for manufacturing a solder preform comprising the steps of:
   (1) mixing high melting point metal particles with a pyrolyzable liquid flux to obtain a mixture;
   (2) charging the mixture into molten solder at a temperature lower than the melting point of the high melting point metal particles followed by stirring and rapid cooling of the molten solder to obtain a mixed mother alloy in which the high melting point metal particles are dispersed;
   (3) preparing a billet by charging the mixed mother alloy into molten solder at a temperature lower than the melting point of the high melting point metal particles followed by stirring, casting into a mold, and rapid cooling of the molten solder;
   (4) extruding the billet with an extruder to form a strip;
   (5) rolling the strip in a rolling mill to form a ribbon which is thinner than the strip; and
   (6) punching the ribbon to a predetermined shape to form a solder preform containing the high melting point metal particles.

16. A process for manufacturing a solder member comprising:
   mixing high melting point metal particles having a particle diameter of at least 20 μm with a pyrolyzable liquid flux to obtain a mixture;
   charging the mixture into molten solder comprising a solder alloy having a lower melting temperature than the high melting point metal particles and stirring to prepare a mixed mother alloy in which unmelted high melting point metal particles are dispersed;
   charging the mixed mother alloy into molten solder, stirring, casting, and solidifying to obtain a cast member comprising a solder alloy matrix phase and high melting point metal particles having a higher melting point than the matrix phase and having a particle diameter of at least 20 μm dispersed in the matrix phase; and
   shaping the cast member.

17. A process as claimed in claim 16 wherein shaping the cast member includes punching the cast member to form a preform.

18. A process as claimed in claim 16 wherein shaping the cast member includes wire drawing.

19. A process as claimed in claim 16 wherein the high melting point metal particles in the matrix phase have a particle diameter of 40-300 μm.

* * * * *